United States Patent
Tsao et al.

(10) Patent No.: US 7,519,886 B2
(45) Date of Patent: Apr. 14, 2009

(54) APPARATUS AND METHOD FOR INTEGRATED FUNCTIONAL BUILT-IN SELF TEST FOR AN ASIC

(75) Inventors: Michael M. Tsao, Yorktown Heights, NY (US); R. Brett Tremaine, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 444 days.

(21) Appl. No.: 11/326,540

(22) Filed: Jan. 5, 2006

(65) Prior Publication Data

US 2007/0157059 A1    Jul. 5, 2007

(51) Int. Cl.
G01R 31/28    (2006.01)

(52) U.S. Cl. ............... 714/733; 714/25; 714/30; 714/42; 714/718; 714/719; 714/720; 714/734; 714/736; 714/738; 714/739; 365/201

(58) Field of Classification Search .................. None
See application file for complete search history.

(56) References Cited

U.S. PATENT DOCUMENTS

| | | | | |
|---|---|---|---|---|
| 6,295,239 | B1 * | 9/2001 | Gopikuttan Nair | 365/201 |
| 6,760,873 | B1 * | 7/2004 | Hao et al. | 714/724 |
| 6,816,991 | B2 * | 11/2004 | Sanghani | 714/733 |
| 6,966,017 | B2 * | 11/2005 | Evans | 714/718 |
| 2003/0051197 | A1 * | 3/2003 | Evans | 714/718 |
| 2005/0257109 | A1 * | 11/2005 | Averbuj et al. | 714/733 |

* cited by examiner

*Primary Examiner*—John P Trimmings
(74) *Attorney, Agent, or Firm*—F. Chau & Associates, LLC

(57) ABSTRACT

We describe, in exemplary embodiments, an on-chip Functional Built-In Self Test ("FBIST") mechanism for testing integrated circuits with internal memory state and complex transaction based interfaces. Such interfaces include system-on-chip applications, memory chip applications, and input/output ("IO") protocol adapter chips.

19 Claims, 3 Drawing Sheets

APPARATUS AND METHOD FOR INTEGRATED FUNCTIONAL BUILT-IN SELF TEST FOR AN ASIC

BACKGROUND OF THE INVENTION

1. Field of the Invention

The present invention relates generally to the field of computer memory, and, more particularly, to an apparatus and method for integrated functional built-in self test for an ASIC.

2. Description of the Related Art

Integrated circuit operational speeds (i.e., signal frequencies) often outpace even the most advanced test equipment. Moreover, these chips often have complex internal state structures with significant embedded memory arrays.

An embedded dynamic random access memory ("EDRAM") data cache chip typically contains the following: an on-chip EDRAM section, which comprises one or more EDRAM macro units; a command logic section to interpret the cache chip data access commands; a write logic section to buffer and write the incoming data into the EDRAM; and a read logic section to read out the data from the EDRAM. Each logic section typically includes a corresponding off-chip interface unit. The off-chip interface section typically includes the following: receivers unit for the command bus; receivers unit for the write data bus; and drivers unit for the read data bus. One or more sets of these off-chip interface units may be on a chip to provide for additional data bandwidth, data throughput, or to provide for concurrent data sharing among more than one processor chip. Solely for the sake of simplicity, a single off-chip interface unit is assumed.

An exemplary existing implementation for an EDRAM chip includes a pseudorandom memory address and data test. The logic of the EDRAM chip may also include the following: traditional deterministic dynamic random access memory ("DRAM") tests (e.g., marching 0's, 1's, stripes, gallops, etc.); a single bit error injected in the command bus and write data bus; a check for corrected data after error injection; memory scrub and fill; and a power saving standby mode memory refresh control.

The prior art of chip or system testing can be characterized as performing one of the following types of tests: a scan test, a pseudo random logic test (described in U.S. Pat. No. 5,369,648 to Nelson, entitled "Built-in Self-Test Circuit"), or random access memory ("RAM") array test (described in U.S. Pat. No. 5,617,531 to Crouch, entitled "Data Processor Having a Built-In Internal Self Test Controller for Testing a Plurality of Memories Internal to the Data Processor"). These techniques are undesirable because they do not test the chip in the way it is used in the system (e.g., at design target speed with many simultaneously switching signals, at system power and thermal conditions, etc.). Further, a number of the existing test methods rely upon very expensive external chip or system testers.

SUMMARY OF THE INVENTION

In one aspect of the present invention, a self-test system integrated on an Application Specific Integrated Chip (ASIC) is provided. The ASIC includes a primary functional logic for performing a particular application. The self-test system includes the following: at least one primary interface operating in the particular application; an input interface protocol generator for generating patterns to be inserted into the at least one primary interface, the at least one primary interface generating a response resulting from the execution of the inserted patterns; an output interface protocol payload checker for determining whether the response is correct by comparing the response to an expected result; a control unit (a) for maintaining coherency between traffic of the at least one primary interface and the primary functional logic, (b) for selecting at least one of the patterns to be inserted, and (c) for controlling duration of operation of the self-test system; a user-interface for receiving a test configuration for operating the control unit and for receiving user-direction for operating the self-test system; and a signature unit for monitoring and reducing the traffic of the at least one primary interface and for generating a signature.

In another aspect of the present invention, a self-test method for an Application Specific Integrated Chip (ASIC) is provided. The self-test method being implemented in a functional built-in self test (FBIST) executed after all previous tests for the ASIC are executed. The self-test method includes the steps of: generating patterns; inserting the patterns into a primary interface on the ASIC; receiving a response from the primary interface, the response resulting from the execution of the inserted patterns by the ASIC; and determining whether the response is correct by comparing the response to an expected result.

BRIEF DESCRIPTION OF THE DRAWINGS

The invention may be understood by reference to the following description taken in conjunction with the accompanying drawings, in which like reference numerals identify like elements, and in which.

DETAILED DESCRIPTION OF PREFERRED EMBODIMENTS

Figure 1:
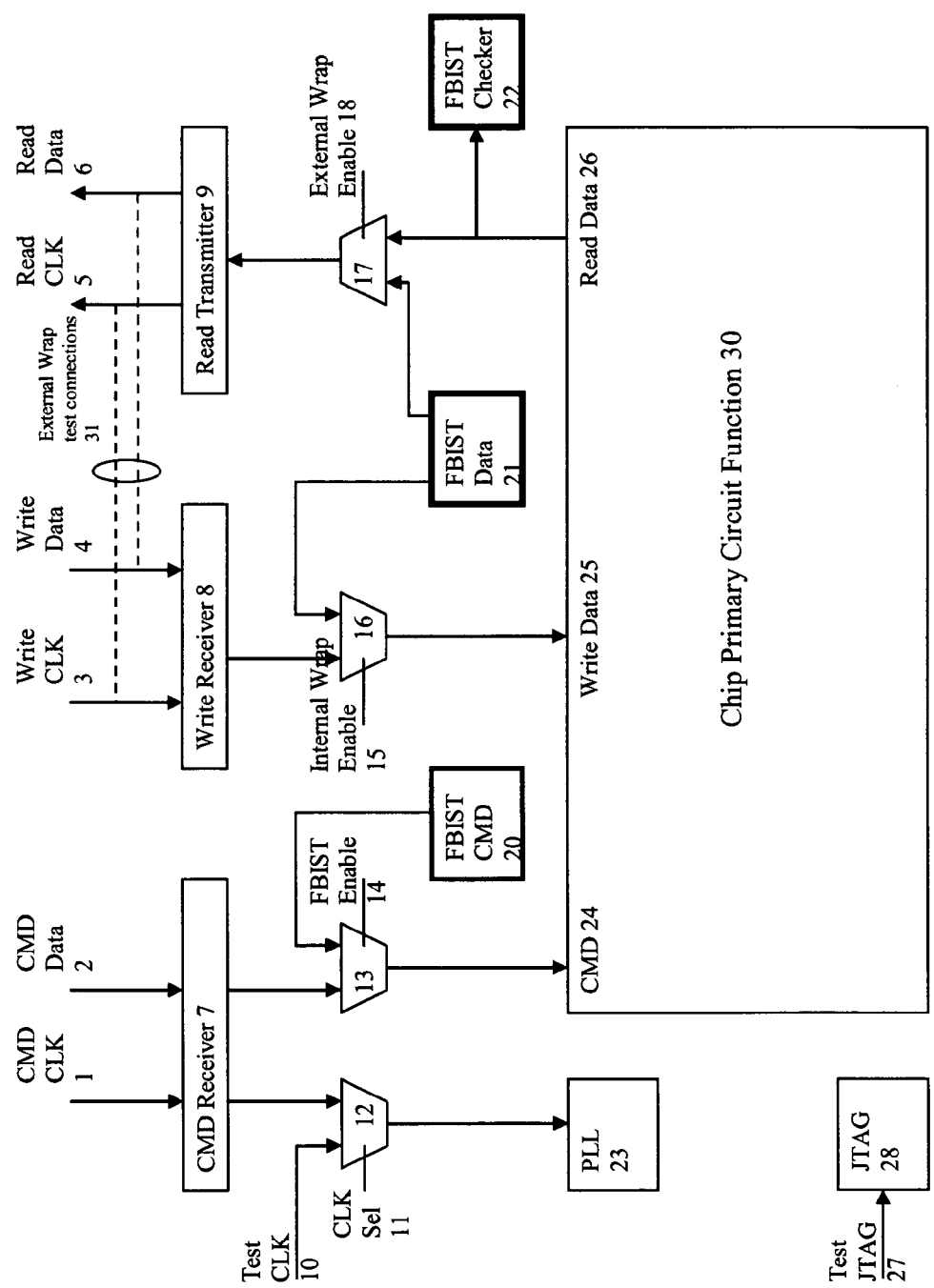
FIG. 1 depicts a block diagram illustrating the inclusion of the Functional BIST ("FBIST") logic in operation with the chip primary circuit functional logic, in accordance with an exemplary embodiment of the present invention.

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

It is to be understood that the systems and methods described herein may be implemented in various forms of hardware, software, firmware, special purpose processors, or a combination thereof. In particular, at least a portion of the present invention is preferably implemented as an application comprising program instructions that are tangibly embodied on one or more program storage devices (e.g., hard disk, magnetic floppy disk, RAM, ROM, CD ROM, etc.) and executable by any device or machine comprising suitable architecture, such as a general purpose digital computer having a processor, memory, and input/output interfaces. It is to be further understood that, because some of the constituent system components and process steps depicted in the accompanying Figures are preferably implemented in software, the connections between system modules (or the logic flow of method steps) may differ depending upon the manner in which the present invention is programmed. Given the teachings herein, one of ordinary skill in the related art will be able to contemplate these and similar implementations of the present invention.

We describe, in exemplary embodiments, an on-chip Functional Built-In Self Test ("FBIST") mechanism for testing integrated circuits with internal memory state and complex transaction based interfaces. Such interfaces include system-on-chip applications, memory chip applications, and input/output ("IO") protocol adapter chips.

This FBIST mechanism provides an at-speed, stand-alone or in-system, self test capability for the target chip. This FBIST capability eliminates the need to develop a separate bench-top tester for the target chip. Additionally, since the FBIST works at system speed, it is also possible to do design target speed functional testing of the chip while the chip is still on the die tester, identifying bad chips. Therefore, potentially only good chips will be bonded to the next-level package modules. Furthermore, this FBIST mechanism, once in the field, can be integrated into the system diagnostic methodology, thus providing additional test coverage and fault isolation capabilities.

In one sense, the FBIST is an implementation of traditional system verification—a random test simulation program executed using gates and latches. FBIST generates functionally correct and coherent chip interface memory read/write commands to randomly selected addresses. FBIST also writes randomly generated data packets, keeps track of the randomly generated data packets, and randomly reads data back for comparison. The present invention can perform all these tasks using the smallest number of stored states, and with the logic working at system speed.

Overview of FBIST Operation with Chip Primary Circuit Function

Referring now to FIG. 1, a diagram illustrating an implementation of the Functional BIST ("FBIST") logic with the chip primary circuit functional logic (30) is shown. The primary circuit functional logic receives commands via primary CMD interface (2, 7, 24), the primary write data via the write data interface (4, 8, 25), and returns the read data via the primary read interface (26, 9, 6). The chip Phase Lock Loop ("PLL") (23) input clock during functional mode is received via the command bus clock (1). For a test mode, a multiplexer (12) is inserted between the command bus clock receiver (7) and the PLL (23). A clock selection control signal (11) determines which source clock is used: CLK (1), or Test CLK (10).

Also illustrated is a chip support and control interface (27) and the associated control logic (28), using Joint Test Action Group ("JTAG") as an example protocol in this diagram. It should be appreciated that other protocols may also be used such as inter-integrated circuit ("I2C") and the like. Through this support interface, the chip primary circuit functional logic and the FBIST logic can (1) receive user direction, chip settings, and test mode configurations, and also (2) return chip and test status information to external logic and chip or to a system test interface.

The FBIST is partitioned (similarly to EDRAM partitioning) into the following parts.

(1) A primary input interface protocol generator for stimulating the chip primary inputs interface. The primarily input interface protocol generator comprises a command section (20) to send commands.

(2) A write section (21) for generating and sending write data.

(3) A read section comprises a primary output interface protocol payload checker (22) for predicting and comparing data read out from the EDRAM.

There is also an overall control section (not shown) that orchestrates the entire FBIST operation.

The FBIST generated command bus data stream is injected into the mission logic via a first special 2-to-1 multiplexer (13), which is inserted between the receivers for the command bus (7) and the primary circuit function mode command logic section (24). The select control (14) of this multiplexer (13) determines which command bus data stream is injected into the cache chip command logic section: mission mode CMD data (2) or FBIST test mode CMD data (20).

Similarly, the FBIST generated write data bus data stream is injected into the mission logic via a second special 2-to-1 multiplexer (16), which is inserted between the receiver for the data bus receiver (8) and the write data logic (25). The select control (15) of this multiplexer (16) determines which write data stream is injected into the chip primary functional logic section: primary circuit function mode Write data (4), or FBIST test mode Write data (21).

The read data primary circuit function logic has two special data connections to the FBIST. First, a copy of all outgoing read data logic (26) is sent to the FBIST logic (22) for comparison of all read data. Second, a third special 2-to-1 multiplexer (17) is inserted between the read data logic (26) and the outgoing drivers for the read data bus (9). This third special multiplexer (17), which is controlled by an External Wrap Enable Select signal (18), is used during a special test wrap mode that "wraps" the off-chip data bus drivers of the read data bus back onto the incoming write data bus receivers (31). In this wrap test mode, FBIST sends the write data out via the third special 2-to-1 multiplexer (17) to the off-chip drivers for the read data bus. The write data than comes out of the chip on the read data bus pins (6), wraps back into the chip (31) via the write bus data receiver (8), and then passes onto the write data mission logic (25). Using this FBIST wrap test mode, the off-chip read data driver (9) and write data receivers (8) are tested. However, this test mode can only function on a special test board that has the data buses wrapped in this self-wrap configuration (31).

On each of the three buses (i.e., command (20), write data (21), and read data (22)), the FBIST logic also monitors all the signals and computes a signature using a Multiple Input Liner Feedback Shift Register ("MILFSR") (not shown). At the end of a FBIST run, this signature can be compared with the signature from any other identically configured FBIST run on an identically configured chip. The signature should match if the chip is operating correctly.

An important aspect of the FBIST random data generation is how large of an amount of different data is generated (or expanded) from a small amount of stored configuration information. In the example of an EDRAM data chip, 17 bits of an address are used to select 256-bytes of data. At any given time, the FBIST logic keep tracks of a limited number of addresses where it has written new data into, for example, 64 locations, from where the FBIST will later read. So for each of these 64 write-read addresses, a random key (e.g., 8 bits) is also kept. The 256-Byte write data, and later the expected read data used by the data checker, is generated on the fly from the stored address (17 bits) and the key (8 bits).

Exemplary Embodiment of Logic Structure

Figure 2:
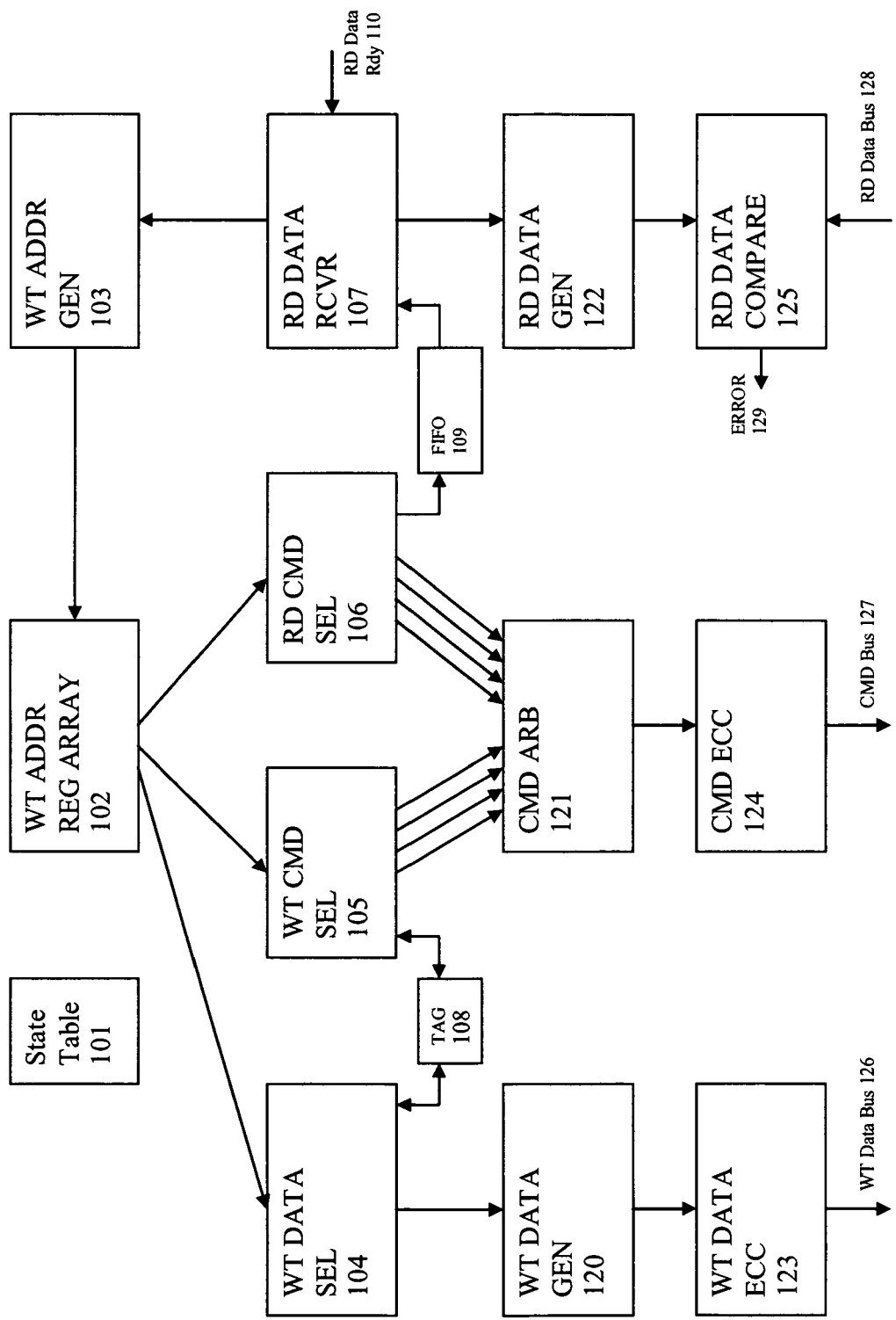
FIG. 2 depicts a block diagram illustrating an implementation of the FBIST logic, in accordance with an exemplary embodiment of the present invention.

Referring now to FIG. 2, a diagram illustrating an implementation of the Functional BIST ("FBIST") logic is shown, in accordance with an exemplary embodiment of the present invention. The FBIST can be divided into two sections: a slower speed address selector control section (101 to 110); and a fast at-speed data generation and command arbitration section (120 to 129).

In the at-speed data section (120 to 129), the write operation Data Pattern Generator (120) produces the data stream to be written into the EDRAM. The Write Data Error Correction Code ("ECC") (123) produces the correct ECC for the Write Data Bus (126). When configured, the ECC (123) can also introduce single bit errors in the data stream by inverting one of the output bits at random intervals. The ECC (123) also computes a signature of the data stream by the means of a Multiple Input Shift Register ("MISR") (not shown).

The at-speed Command Arbitrator (121) determines which EDRAM commands to send to the command bus (127). The corresponding Command ECC logic (124) produces the correct ECC for the command data stream to be sent out on the Command Bus (127). The Command ECC logic (124), when configured, can also introduce single bit errors in the command stream by inverting one of the output bits at random intervals. The Command ECC logic (124) also computes a signature of the command stream by the means of a MISR (not shown).

The at-speed read operation Read Data Pattern Generator (122) produces the expected data stream to be read from the EDRAM on the Read Data Bus (128). The Read Data Comparator (125) compares the expected data with the actual read data from the EDRAM. The Read Data Comparator (125) also computes a signature of the data stream by the means of a MISR (not shown). When a data mismatch is detected, an ERROR signal (129) is raised.

The storage location reference address selector control section (101 to 110) maintains coherency between stimulus command traffic and a stored state within the primary logic function. The storage location reference address selector control section (101 to 110) also selects transaction command and data patterns, target memory addresses, and an injected error state. The storage location reference address selector control section (101 to 110) further tests duration. The storage location reference address selector control section (101 to 110) can operate at a slower speed because, once a command is generated, several at-speed fast cycles are needed to produce the necessary data stream. Furthermore, the Write Command Selector (105) and the Read Command Selector (106) can be replicated multiple times. This is done to keep as many possible EDRAM read/write operations active simultaneously.

A Register Array (102) is used to store the Write operation storage location reference addresses and to seed a random number generator (not shown). A State Table (101) is used to keep track of the states of active write storage location reference addresses and commands. The State Table (101) can be implemented using register latches. A Write Tag Memory (108) is used to keep track of the states of active write command tags. The Write Tag Memory (108) can be implemented with register latches. A First In First Out ("FIFO") queue (109) is used to keep track of the order of EDRAM read operations, because the EDRAM services the reads in the order they are received.

The Write Command Selector (105) scans through all the idle write storage location reference addresses stored in the Register Array (102) and selects one address to be the next EDRAM address to write into. The next available Write Tag is obtained by scanning through the content of the Write Tag Memory (108) and looking for an unused entry. Once the unused entry is found, the Register Array's (102) value of the EDRAM write storage location reference address is written into the Write Tag Memory (108), indicating a Write Command Tag is now in use. Next, a write command is formulated and passed to the Command Arbitrator (121) to be sent out on the Command bus. The State Table (101) is then marked, indicating this EDRAM address can now be written into with new data.

A Write Data Selector (104) scans through all the active Write Commands stored in the Write Tag Memory (108) and selects one to process. The Register Array (102) index stored in the Write Tag Memory (108) is used to read the next EDRAM address and random seed. Once the new data is sent out by the write operation Write Data Pattern Generator (120), the State Table (101) is marked, indicating this EDRAM address can now be read from with new expected data. The Register Array (102) index stored in the Tag Memory (108) is removed, indicating this Write Command Tag is available to be used again.

The Write Command Selector (105) and the Write Data Selector (104) can also be configured such that only one command and a specific data pattern is valid. This command, and the associated data pattern, can be configured to run once or indefinitely.

A Read Command Selector (106) scans through all the write storage location reference addresses stored in the Register Array (101) that already has new data Written into, and selects one address to be the next EDRAM address to read from. The Read Command Selector (106) formulates a Read command and passes it to the Command Arbitrator (121) to send out on the Command bus. Once this is done, the State Table (102) is marked, indicating this EDRAM storage location reference address has an active read operation in progress. The read storage location reference address and the associated data ransom key are put into the FIFO (109) to pass to the Read Data Receiver (107).

The Read Data Receiver (107) monitors the EDRAM read data output logic for the next EDRAM Read Data Ready signal (110). When the next new data is ready from the EDRAM read logic, a read storage location reference address and the associated random Key is pulled off from the Read Address FIFO (109), and passed to the at-speed read operation Read Data Pattern Generator (122). Thus, the EDRAM Read Data (128) can be compared with the expected data by using the Read Data Comparator (125). A signal is then sent to the Write Address Generator (103), which produces a new EDRAM write storage location reference address by the means of a random number generation Linear Feedback Shift Register, and which stores the new Write Address into the Register Array (102). The State Table (101) is marked such that this new EDRAM address is available to be written into.

The Read Data Receiver (107) can also be configured to check the external bus protocol, and to verify the bus protocol for correct bus protocol operation with the system specification. Consider the following example. For each write command, a check for the receive acknowledgement and the write completion response packet is performed. For each read command, a check for the sequential order of returned data is performed. For writes to and reads from the same address, check for coherence is performed.

The Read Data Comparator (125) asserts an Error signal (129) on a miss compare. The mismatched data and EDRAM address are captured and reported for later analysis. The FBIST can stop on the first such miscompare. Alternatively, the FBIST can be configured to continuously run while counting the total number of errors, capturing only the most recent error. In addition to the FBIST miscompare method to detect errors, the present embodiment also relies upon the error detection and capture facilities in the chip core logic to detect any errors, and to capture the faulty data patterns. Together with the FBIST capability to continuously run while counting all types of errors (in FBIST and in the chip core logic), chip primary functional logic error detection and capture facility is particularly useful when one wishes to characterize the bit error rate of any part of the chip: EDRAM, core logic, and the external data buses (when used in the wrap mode).

Operation of Read-Only Tests

The Functional BIST described in the previous section performs random Writes into and Reads from the EDRAM. In addition to this Write-Followed-by-Reads (i.e., Write-Read) address space, the FBIST can also be configured to operate with an additional Write-Once-Read-Many (i.e., Read-Only) EDRAM address space. When this Read-Only feature is enabled, upon system initialization and before the main FBIST function is started, the Write Data Selector (104) can be instructed to write a set of deterministic data patterns into this Read-Only address space. Furthermore, one or more of the Read Command Selectors (106) can be configured to operate only within this Read-Only EDRAM address space. The configured Read Command Selector (106) does not need to access the Write Address Register Array (102), because the address spaces are configured to be disjoint (i.e., none of the address spaces overlap) to ensure correct FBIST operation.

Data Structure

Register Array (102): One entry is used for each Write-Read address. For example, a Register Array with 64 entries means the FBIST can have 64 writable EDRAM locations active at any one time. Each entry contains a portion of the EDRAM address bits and a random seed to be used by the Data Pattern Generator to produce the data stream. The complete EDRAM address is an amalgamation of the partial address bits stored in the Register Array and the index into the Register Array. Accordingly, each EDRAM Write-Read address is guaranteed to be unique.

State Table (101): The following three data bits are used to define the state of each Write-Read address stored in the Register Array (102): Command Ready, Write Data Ready, and Read Data Ready.

Command Ready: When set by Write Address Generator (103), the Common Ready data bit indicates that Write Command Selector (105) should generate a Write Command for this address. The Command Ready data bit is reset after the command is sent by the Command Arbitrator (121).

Write Data Ready: When set by Write Command Selector (105), after the command is sent by the Command Arbitrator (121), the Write Data Ready data bit indicates that the Write Data Selector (104) should write out a data stream for this address. The Write Data Ready data bit is reset after the data is written out by the Write Data Generator (120).

Read Data Ready: When set by the Write Data Selector (104), after the data is written out by the Write Data Generator (120), the Read Data Ready bit indicates that the data can now be read back from the EDRAM for comparison. The Read Data Ready data bit is reset by the Generator Write Address (103).

Write Tag Memory (108): One entry is used for each legal write data tag. Write data tags are used to track and to match up the write data commands and the corresponding write data. For example, if the system allows for 16 outstanding write commands to be active at any one time, 16 entries are required for the Tag Memory. The content of each Tag entry is the index into the Register Array (102), which is written by the Write Command Selector (105) when it generates the write command for this EDRAM address. The Write Data Selector (104) uses the Register Array (102) index stored in the Tag Memory (108) to read the next EDRAM address and random seed.

First-In-First-Out (FIFO) queue (109): One entry is used for each outstanding Reads address in flight. Each entry contains the fully formed EDRAM address, and a random seed used by the Read Data Pattern Generator (122) to produce the expected data stream.

Exemplary Embodiments of Process Flow

Figure 3:
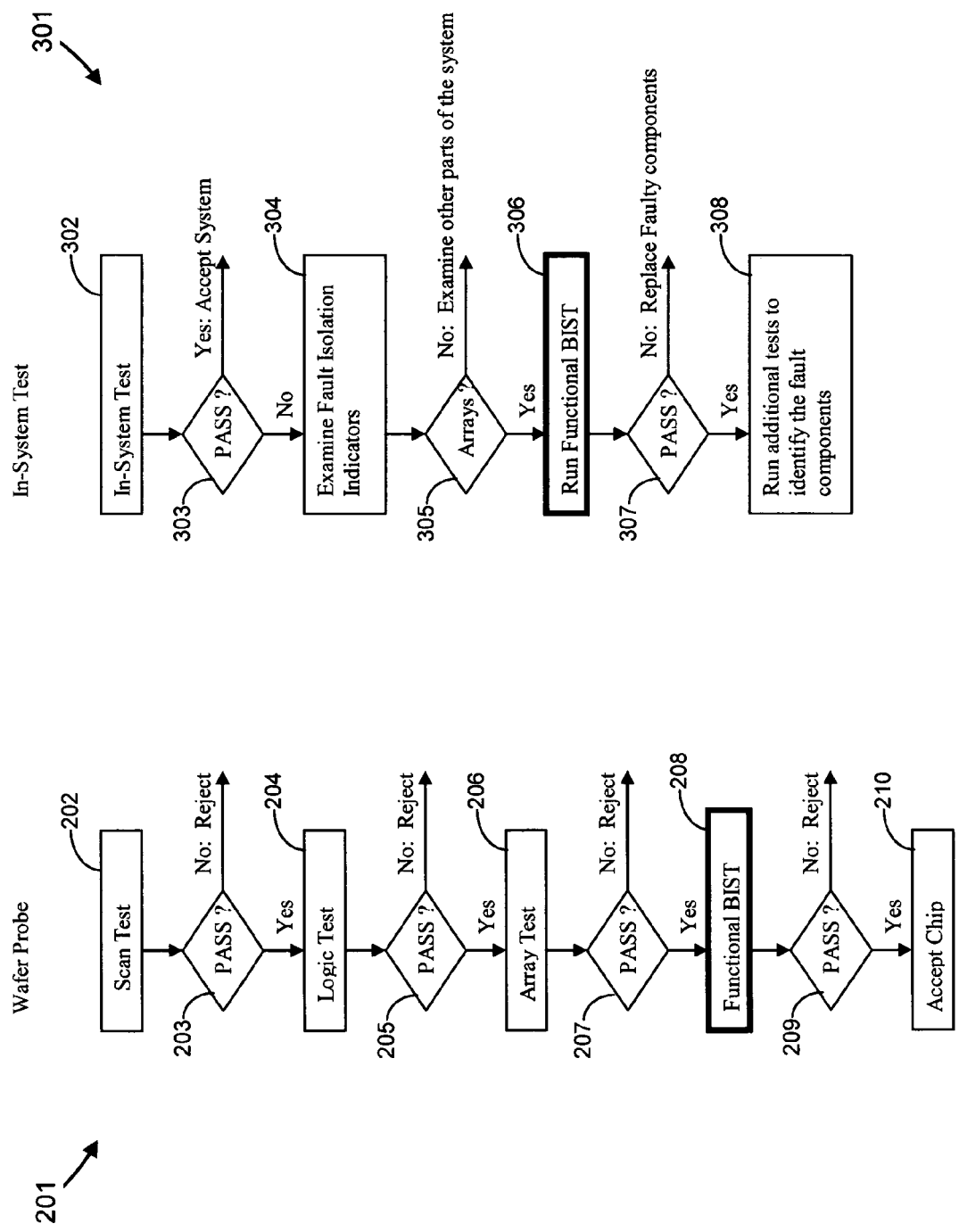
FIG. 3 depicts a flow diagram illustrating a first method of using the FBIST logic in a wafer probe test and a second method of using the FBIST logic in an in-system chip fault isolation test, in accordance with exemplary embodiments of the present invention.

Referring now to FIG. 3, a diagram illustrating two methods of using the FBIST logic. A first method (201) involves a wafer probe. A second method (301) involves an in-system chip fault isolation test. For a chip wafer probe, a Scan test is performed (at 202). If the wafer probe passes the Scan test (at 203), then a Logic test is performed (at 204). If the wafer probe passes the Logic test (at 205), then an Array test is performed (at 206). If the wafer probe passes the Array test (at 207), then a FBIST test, in accordance with an exemplary embodiment of the present invention, is performed (at 208) to further identify an acceptable, good chip. If the wafer probe passes the FBIST test (at 209), then accept the chip (at 210).

An in-system chip fault isolation test (301) is generally different from the wafer probe test (201) because the in-system chip fault isolation test (301) is usually performed at the factory or at customer site. An in-system test is performed (at 302). If the in-system test is not passed (at 303), then fault isolation indicators are examined (at 304). If the fault isolation indicators indicate a fault in the arrays (at step 305), then for a system that has chips with FBIST, a FBIST test is performed (at 306). If the additional FBIST test does not pass (at 307), then additional tests are performed (at 308) to further identify the failing components in the system.

Although the EDRAM chip is used in the exemplary embodiments above, it should be appreciated that the present invention may be applicable for any application specific integrated circuit ("ASIC"), as contemplated by those skilled in the art.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A self-test system integrated on an Application Specific Integrated Chip (ASIC), the ASIC including a primary functional logic for performing a particular application, the self-test system comprising:
   at least one primary interface operating in the particular application;
   an input interface protocol generator for generating patterns to be inserted into the at least one primary interface, the at least one primary interface generating a response resulting from the execution of the inserted patterns;
   an output interface protocol payload checker for determining whether the response is correct by comparing the response to an expected result;
   a control unit (a) for maintaining coherency between traffic of the at least one primary interface and the primary functional logic, (b) for selecting at least one of the patterns to be inserted, and (c) for controlling duration of operation of the self-test system;
   a user-interface for receiving a test configuration for operating the control unit and for receiving user-direction for operating the self-test system; and
   a signature unit for monitoring and reducing the traffic of the at least one primary interface and for generating a signature,
   wherein the input interface protocol generator generates the patterns at random or prescribed time intervals.

2. The self-test system of claim 1, wherein the patterns comprise at least one of a data pattern, a command pattern, and a target memory address pattern.

3. The self-test system of claim 1, wherein the at least one primary interface comprises:
   a chip output driver circuit for receiving read data from the primary functional logic; and
   a chip input receiver circuit for receiving external command and write data.

4. The self-test system of claim 3, further comprising: a record logic for recording the state of the primary functional logic: (a) before the chip output driver circuit receives the read data, (b) after the chip output driver circuit receives the read data, (c) before the chip input receiver circuit receives the external command and write data, and (d) after the chip input receiver circuit receives the external command and write data.

5. The self-test system of claim 1, wherein the input interface protocol generator generates illegitimate patterns to introduce error into the at least one primary interface.

6. The self-test system of claim 1, wherein the input interface protocol generator generates one of random data patterns, prescribed data patterns, random command patterns, or prescribed command patterns.

7. The self-test system of claim 1, wherein the input interface protocol generator generates random target memory address patterns or prescribed target memory address patterns.

8. The self-test system of claim 1, wherein the self-test system stops operating or continues to operate after the at least one primary interface or the control unit detects an error.

9. The self-test system of claim 1, further comprising: a count logic for counting a number of errors detected from the at least one primary interface.

10. The self-test system of claim 1, further comprising: a linear feedback shift register for generating pseudo-random patterns.

11. The self-test system of claim 1, further comprising: a capture logic for capturing a state of the self-test system after (a) the at least one primary interface outputs an error, or (b) output interface protocol payload checker determines the response of the at least one primary interface is incorrect;
   wherein the state of the self-test system allows the user to access the patterns at the time of the error or the incorrect response.

12. The self-test system of claim 1, wherein the ASIC executes the patterns once or indefinitely.

13. The self-test system of claim 1, wherein the input interface protocol generator selects at least one of a plurality of prescribed patterns.

14. The self-test system of claim 1, wherein the input interface protocol generator selects one command pattern and one data pattern.

15. The self-test system of claim 1, further comprising:
   a signature reading logic for reading a first signature of a first run of the self-test system and a second signature of a second run of the self-test system.

16. The self-test system of claim 1, wherein the user-interface allows the user to access the self-test system while the ASIC executes the patterns indefinitely.

17. A self-test method for an Application Specific Integrated Chip (ASIC), the self-test method being implemented in a functional built-in self test (EBIST) executed after all previous tests for the ASIC are executed, the self-test method comprising the steps of:
   generating patterns at random time intervals;
   inserting the patterns into a primary interface on the ASIC;
   receiving a response from the primary interface, the response resulting from the execution, by the ASIC. of the inserted patterns; and
   determining whether the response is correct by comparing the response to an expected result.

18. The self-test system of claim 17, wherein the patterns comprise at least one of a data pattern, a command pattern, and a target memory address pattern.

19. A self-test system integrated on an Application Specific Integrated Chip (ASIC), the ASIC including a primary functional logic for performing a particular application, the self-test system comprising:
   at least one primary interface operating in the particular application;
   an input interface protocol generator for generating patterns to be inserted into the at least one primary interface, the at least one primary interface generating a response resulting from the execution of the inserted patterns;
   an output interface protocol payload checker for determining whether the response is correct by comparing the response to an expected result;
   a control unit (a) for maintaining coherency between traffic of the at least one primary interface and the primary functional logic, (b) for selecting at least one of the patterns to be inserted, and (c) for controlling duration of operation of the self-test system;
   a user-interface for receiving a test configuration for operating the control unit and for receiving user-direction for operating the self-test system;
   a signature unit for monitoring and reducing the traffic of the at least one primary interface and for generating a signature; and
   a signature reading logic for reading a first signature of a first run of the self-test system and a second signature of a second run of the self-test system.

* * * * *